(12) United States Patent
Rodriguez et al.

(10) Patent No.: US 9,977,085 B2
(45) Date of Patent: May 22, 2018

(54) METHOD AND SYSTEM FOR DETERMINING A SYNCHRONOUS MACHINE FAULT CONDITION

(71) Applicant: ABB Schweiz AG, Baden (CH)

(72) Inventors: Pedro Rodriguez, Västerås (SE); Subrat Sahoo, Västerås (SE); Cajetan Pinto, Mumbai (IN)

(73) Assignee: ABB Schweiz AG, Baden (CH)

( * ) Notice: Subject to any disclaimer, the term of this patent is extended or adjusted under 35 U.S.C. 154(b) by 0 days. days.

(21) Appl. No.: 15/507,110

(22) PCT Filed: Sep. 8, 2015

(86) PCT No.: PCT/EP2015/070419
§ 371 (c)(1),
(2) Date: Feb. 27, 2017

(87) PCT Pub. No.: WO2016/037995
PCT Pub. Date: Mar. 17, 2016

(65) Prior Publication Data
US 2018/0052206 A1    Feb. 22, 2018

(30) Foreign Application Priority Data
Sep. 10, 2014  (EP) .................................... 14184248

(51) Int. Cl.
*G01R 31/02*  (2006.01)
*G01K 13/00*  (2006.01)
(Continued)

(52) U.S. Cl.
CPC ................. *G01R 31/346* (2013.01)

(58) Field of Classification Search
CPC .................................................... G01R 31/346
(Continued)

(56) References Cited

U.S. PATENT DOCUMENTS

| 7,592,772 | B2 | 9/2009 | Nandi et al. | |
| 2009/0091289 | A1 | 4/2009 | Nandi et al. | |
| 2009/0296777 | A1* | 12/2009 | Fish | H02P 9/302 |
| | | | | 374/152 |

FOREIGN PATENT DOCUMENTS

| CN | 102636751 A | 8/2012 |
| CN | 202856679 U | 4/2013 |
| EP | 0306319 A1 | 3/1989 |

OTHER PUBLICATIONS

Penman et al. "The detection of stator and rotor winding short circuits in synchronous generators by analysing excitation current harmonic"; Mar. 18, 1996; pp. 137-142; XP006510158.*
(Continued)

*Primary Examiner* — Farhana Hoque
(74) *Attorney, Agent, or Firm* — Whitmyer IP Group LLC

(57) ABSTRACT

A method and system of determining an electro-mechanical fault condition in a synchronous machine having a stator, a rotor, and exciter. The method includes: a) obtaining an exciter current signal which is a measurement of an exciter current through stationary windings of the exciter, b) transforming the exciter current signal to obtain an exciter current frequency spectrum, and c) determining whether an electro-mechanical fault condition is present, and a type of the electro-mechanical fault condition, based on harmonic content related to the frequency of the stator, of the exciter current frequency spectrum.

8 Claims, 2 Drawing Sheets

(51) Int. Cl.
*H02P 1/46* (2006.01)
*G01R 31/34* (2006.01)

(58) Field of Classification Search
USPC .......................... 374/152; 324/240, 529, 545
See application file for complete search history.

(56) References Cited

OTHER PUBLICATIONS

International Preliminary Report on Patentability Application No. PCT/EP2015/070419 Completed: Dec. 12, 2016 11 Pages.
International Search Report & Written Opinion Application No. PCT/EP2015/070419 Completed Date: Nov. 30, 2015; dated Apr. 20, 2016 18 Pages.
Shuting, Wan, et al.: "The Analysis of Generator Excitation Current Harmonics on Stator and Rotor Winding Fault" North China Electric Power University, Baoding, China; Jul. 9-12, 2016 5 Pages.
Penman, J. et al.: "The detection of stator and rotor winding short circuits in synchronous generators by analysing excitation current harmonics" International Electric Power Generation, International Conference (conf. pub. No. 419) Durham, United Kingdom; Mar. 18-20, 1996 6 Pages.

* cited by examiner

METHOD AND SYSTEM FOR DETERMINING A SYNCHRONOUS MACHINE FAULT CONDITION

TECHNICAL FIELD

The present disclosure generally relates to synchronous machines. In particular, it relates to a method of determining whether a fault condition is present in a synchronous machine, and in case a fault condition is present, identifying the type of fault condition. Furthermore, this disclosure also relates to a computer program product and a synchronous machine electro-mechanical fault condition monitoring system which implement the method.

BACKGROUND

Synchronous machines, i.e. synchronous motors and synchronous generators, typically comprise a rotor and a stator. The rotor and stator interact electromagnetically such that rotation of the rotor is obtained in case the synchronous machine is a motor, and such that current is induced in the stator coils in case the synchronous machine is a generator.

A number of fault conditions may occur in a synchronous machine, both in the stator and in the rotor. Such fault conditions may instantaneously introduce noticeable deviations in behaviour of the synchronous machine, or they may go unnoticed for a longer period of time, which only after months or even years manifests itself in a catastrophic breakdown.

Traditionally, stator current and synchronous machine vibration measurements have been preferred monitoring methods for determining the presence of a fault condition. Stator current measurements must however be performed under the high voltage conditions of the stator, which therefore requires expensive sensor equipment able to withstand such conditions, in addition to safety considerations for undertaking such measurements. Furthermore, it has been shown that vibration levels do not reflect synchronous machine conditions in a satisfactory manner.

CN102636751 A discloses a method where current that magnetises the electromagnets of the rotor is measured. This current is provided by an exciter, which is a device that feeds current to the rotor windings to magnetise the electromagnets of the rotor measured at the main machine rotor. The current is measured at the rotor coils to determine stator winding turn-to-turn short circuits and rotor winding turn-to-turn short circuits. The method utilises Fast Fourier Transform to extract the harmonics of the field current.

The measurements that are required in CN102636751 A may however be difficult to implement, and the utilised sensors must be able to withstand relatively high currents.

The paper "The detection of stator and rotor winding short circuits in synchronous generators by analysing excitation current harmonics", by Penman J et al: Opportunities and advances in international electric power generation, International conference on (conf. publ. no. 419) Durham, UK 18-20 Mar. 1996, discloses that the harmonic components present in the generator excitation current may be used to detect stator and rotor winding short circuits. It is disclosed that the machines under test have a rotating excitation system, and it is reasoned that it should be possible to detect the presence of rotor short circuits by inspection of the harmonic components in the exciter stator. FIG. 8 of this disclosure shows the exciter stator current harmonic components plotted for different frequencies both under normal conditions and in the event of stator inter-turn faults, while it is concluded that from this graph that it can be seen that it may indeed be possible to detect rotor short circuits through examination of exciter current harmonics.

SUMMARY

In view of the above, an object of the present disclosure is to provide a method and a system which simplifies fault condition type determination.

The inventors have realised that it is possible to measure the exciter current and utilise the frequency spectrum of this current to determine a variety of different faults of a synchronous machine. With exciter current is herein meant a current that flows through stationary windings of the exciter.

Hence, according to a first aspect of the present disclosure there is provided a method of determining an electro-mechanical fault condition in a synchronous machine having a stator, a rotor, and an exciter, wherein the method comprises:

a) obtaining an exciter current signal which is a measurement of an exciter current flowing through stationary windings of the exciter, b) transforming the exciter current signal to obtain an exciter current frequency spectrum, and c) determining whether an electro-mechanical fault condition is present, and a type of the electro-mechanical fault condition, based on harmonic content related to the stator frequency of the stator, of the exciter current frequency spectrum.

A technical effect which may be obtainable by means of measuring the exciter current flowing through the stationary windings of the exciter, thus obtaining the exciter current signal, is simplification of obtaining the harmonic content and thus the characteristic signature spectra of different synchronous machine electro-mechanical faults. This may in particular be obtained because the measurement point is stationary and outside the machine rotating parts. This is a surprising result found by the inventors. In particular, it is surprising that electro-mechanical faults related to the main machine, e.g. rotor, stator and eccentricity faults, propagate through a rectifier and inductively to the exciter stator in the case of a rotating exciter, and inductively through a transformer core of a step-down transformer in the event of a static exciter.

Furthermore, the currents are lower at the stationary windings of the exciter than in the main machine parts, resulting in that the sensor(s) utilised can be rated for lower currents than when currents are measured at the rotor, or stator, of a synchronous machine, further facilitating the compliance with the safety considerations on the machine side measurements. Cheaper sensors may therefore be utilised for the exciter current measurements.

With electro-mechanical fault is meant an electrical fault that arises due to mechanical damage.

According to one embodiment the harmonic content utilised to determine the type of electro-mechanical fault condition includes a component that is a rational number multiple of the stator frequency.

According to one embodiment the exciter is a rotating exciter having an exciter stator and an exciter rotor, wherein the stationary windings of the exciter are exciter stator windings and wherein the exciter current signal is an exciter stator current.

According to one embodiment the rotating exciter has a DC/AC type of stator-rotor arrangement.

According to one embodiment in case the harmonic content of the exciter current frequency spectrum comprises a dominant frequency component at six times the power supply frequency it is determined in step c) that a rotor short-circuit fault is present.

According to one embodiment in case the harmonic content of the exciter current frequency spectrum comprises a dominant frequency component at two times the power supply frequency it is determined in step c) that a stator short-circuit fault is present.

According to one embodiment, in case the harmonic content of the exciter current frequency spectrum comprises a dominant frequency component at the rotation frequency of the rotor compared to a frequency component at the rotation frequency of the rotor present during healthy conditions, and in case a direct current, DC, component of the exciter current signal is greater than during healthy conditions it is determined in step c) that a static eccentricity fault is present.

According to one embodiment the rotating exciter has an AC/AC type of stator-rotor arrangement.

According to one embodiment in case the harmonic content of the exciter current frequency spectrum comprises a first dominant frequency component at the difference of the power supply frequency and a rotation frequency of the rotor and a second dominant frequency component at the sum of the power supply frequency and the rotation frequency of the rotor, it is determined in step c) that a rotor short-circuit fault is present.

According to one embodiment in case the harmonic content of the exciter current frequency spectrum comprises a dominant frequency component at $3*f_s(1-2s)$, where $f_s$ is the power supply frequency and s is the rotor slip, it is determined in step c) that a stator short-circuit fault is present.

According to one embodiment the exciter is a static exciter comprising a transformer, wherein the stationary windings of the exciter are primary windings of the transformer and wherein the exciter current signal is a rectifier output current.

According to one embodiment the fault condition is a stator fault, a rotor fault, or a combination thereof, of the synchronous machine.

According to a second aspect of the present disclosure there is provided a computer program product comprising computer-executable components for causing a synchronous machine electro-mechanical fault condition monitoring system to perform the method according to the first aspect when the computer-executable components are run on processor circuitry of the synchronous machine electro-mechanical fault condition monitoring system.

According to a second aspect of the present disclosure there is provided a synchronous machine electro-mechanical fault condition monitoring system comprising an exciter current sensor arranged to measure an exciter current flowing through stationary windings of an exciter, processor circuitry arranged to receive an exciter current signal of a measured exciter current, from the exciter current sensor, and a storage unit storing instructions that, when executed by the processor circuitry causes the synchronous machine electro-mechanical fault condition monitoring system to perform the method according to the first aspect.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise. Moreover, any steps of the method presented herein need not necessarily be performed in the described order, unless explicitly stated so.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1A:
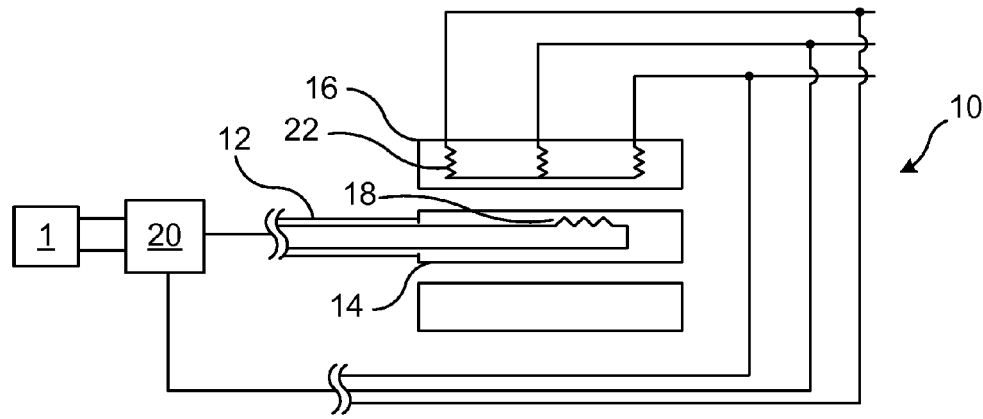
FIG. 1a s schematically depicts an example of a general three-phase synchronous machine configuration.

With reference to FIG. 1a, an example of a synchronous machine 10 is shown. The exemplified synchronous machine comprises a rotor assembly 14, and a stator 16 placed outside the rotor assembly 14 periphery for electromagnetic interaction with the stator 16 via rotational motion. Although a three-phase synchronous machine 10 is exemplified in FIGS. 1a-c, it should be noted that a synchronous machine for the purpose of this disclosure may have any number of electrical phases.

The rotor assembly 14 may comprise electromagnets and field windings 18, which when current flows through them, magnetise the electromagnets. The synchronous machine 10 further comprises an exciter 20. The exciter 20 is a device which is arranged to provide a direct current to the field winding(s) 18 of the rotor assembly 14 to power the electromagnet(s). The exciter 20 can be fed with current from stator windings 22 of the synchronous machine 10, as shown in FIGS. 1a-c, or by an external auxiliary power supply.

Figure 1B:
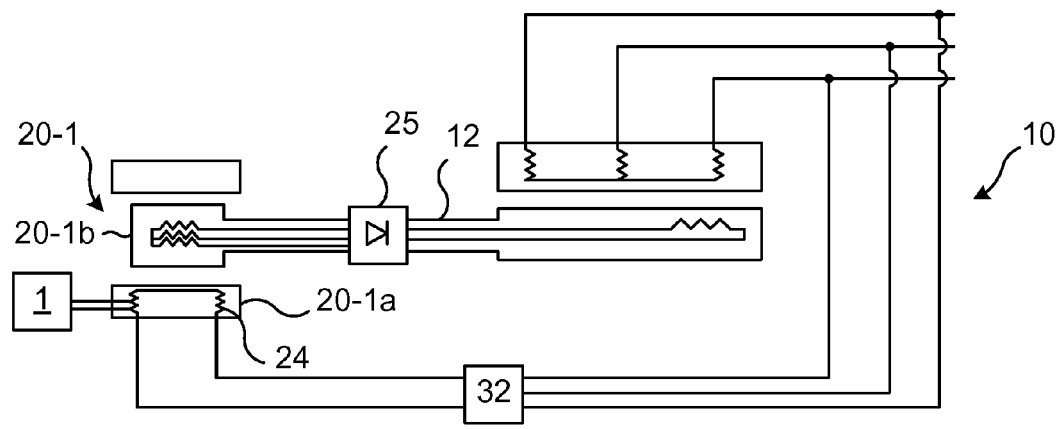
FIG. 1b schematically depicts an example of a three-phase synchronous machine configuration with a rotating exciter.

The exciter 20 may be a rotating exciter 20-1, as shown in FIG. 1b, which comprises an exciter stator 20-1a and an exciter rotor 20-1b, the latter being formed by, for example, the shaft 12 of the rotor assembly 14 of the synchronous machine 10. The windings 24 of the exciter stator 20-1a are herein defined to be the stationary windings of a rotating exciter 20-1. In the event the exciter is a rotating exciter, the stator may have a DC/AC type stator-rotor arrangement in which case the exciter stator is fed with a direct current, as shown in FIG. 1b, in which case a rectifier 32 is arranged to provide direct current to the exciter stator 20-1a. Alternatively, the exciter may have an AC/AC type stator-rotor arrangement in which case the exciter stator is fed with an alternating current. In both cases, the current output from the exciter is fed through a rectifier 25, which provides a direct current to the field windings of the rotor.

Figure 1C:
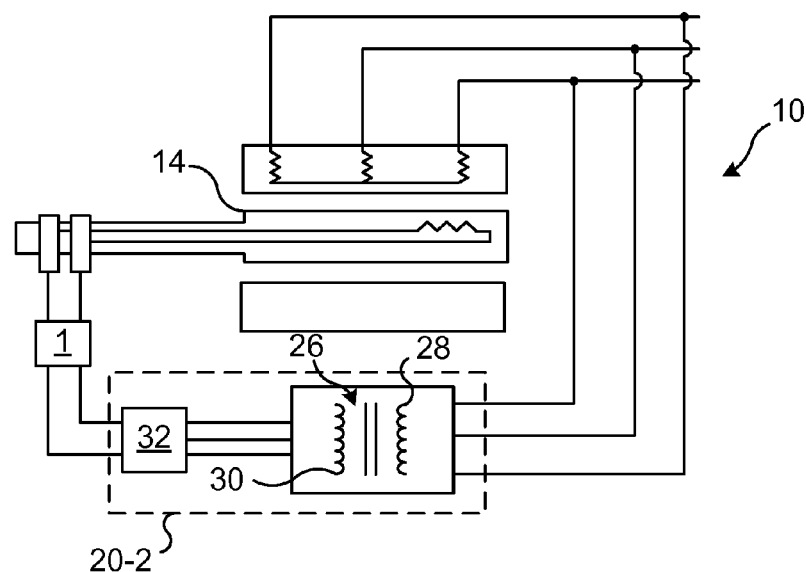
FIG. 1c schematically depicts an example of a general three-phase synchronous machine configuration with a static exciter.

As an alternative to a rotating exciter, the exciter may be a static exciter 20-2, as shown in FIG. 1c, comprising a transformer 26, typically a step-down transformer. The primary windings 28 of the transformer 26 are connected through an auxiliary power supply or through the stator windings 22 and the secondary windings 30 are connected to a rectifier 32 which rectifies the alternating current output from the secondary windings 30 of the transformer 26 to a direct current to be fed to the field windings 18 of the rotor assembly 14 utilising brushes. When referring to stationary windings in the context of a static exciter in the following, the output of a rectifier 32 connected to the secondary windings 30 is meant.

The synchronous machine 10 may be a low voltage machine, a medium voltage machine or a high voltage machine, and it may have any number of electrical phases.

The present disclosure provides a synchronous machine electro-mechanical fault condition monitoring system and a method for electro-mechanical fault condition detection and determination by means of current measurements across the stationary windings of the exciter, by transforming the measured current to its frequency spectrum to obtain the harmonic content thereof, and by analysing the harmonic content.

Figure 2:
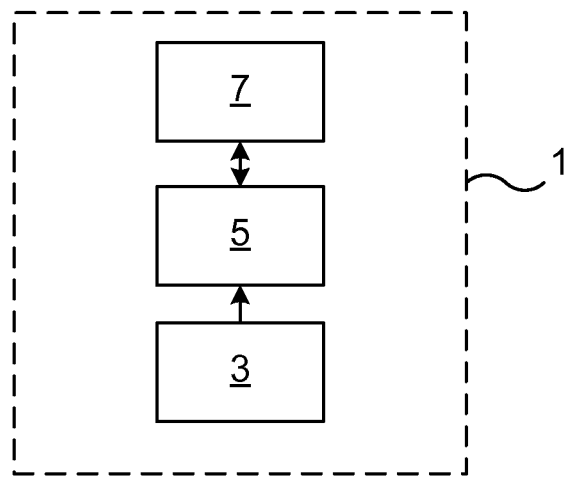
FIG. 2 schematically depicts an example of a synchronous machine electro-mechanical fault condition monitoring system.

FIG. 2 depicts an example of a synchronous machine electro-mechanical fault condition monitoring system 1. It may be noted that the synchronous machine electro-mechanical fault condition monitoring system 1 is also shown in FIGS. 1a-c, where it is coupled to a respective exciter 20, 20-1, 20-2.

The synchronous machine electro-mechanical fault condition monitoring system 1 comprises an exciter current sensor 3 arranged to measure an exciter current that flows through a stationary winding of an exciter.

The synchronous machine electro-mechanical fault condition monitoring system 1 further comprises processor circuitry 5 and a storage unit 7. The processor circuitry 5 is configured to obtain exciter current signals, i.e. exciter current measurements, from the exciter current sensor 3. The storage unit 7 stores instructions or computer-executable components that, when executed by the processor circuitry 5 causes the synchronous machine electro-mechanical fault condition monitoring system 1 to perform the method presented herein. The processor circuitry 5 is thus arranged to transform the exciter current signal to obtain an exciter current frequency spectrum containing the harmonic content of the exciter current signal. The transformation may for example be Fourier transformation, or any variation thereof, or any other mathematical transformation that allows frequency analysis of the exciter current signal.

Furthermore, the processor circuitry 5 is arranged to determine whether an electro-mechanical fault condition is present based on harmonic content of the exciter current frequency spectrum, and to identify the type of electro-mechanical fault condition.

The present inventors have deduced a number of frequency spectra for the exciter current signal, characteristic for certain electro-mechanical fault conditions in a synchronous machine. Each of these frequency spectra is unique for a certain fault condition.

Table I below illustrates the type of failure for a rotating exciter having a DC/AC type of stator-rotor arrangement, and the corresponding signature in the harmonic content of the exciter current frequency spectrum of the transformed exciter current signal. $f_s$ is the power supply frequency, i.e. the frequency of the current flowing through the stator windings of the synchronous machine.

TABLE I

| Electro-mechanical fault type | Signature in harmonic content of the exciter current |
|---|---|
| Rotor short-circuit | $6*f_s$ |
| Stator short-circuit | $2*f_s$ |

Thus, in the event that it is determined by the processing circuitry 5 that the harmonic content of the exciter current frequency spectrum contains a dominant frequency component at six times the power supply frequency, it can be concluded that a rotor short-circuit fault has occurred at the rotor of the synchronous machine.

In the event that it is determined by the processing circuitry 5 that the harmonic content of the exciter current frequency contains a dominant frequency component at two times the power supply frequency, it can be concluded that a stator short-circuit fault has occurred at the stator of the synchronous machine.

Table II below illustrates the type of failure for a rotating exciter having an AC/AC type of stator-rotor arrangement, and the corresponding signature in the harmonic content of the exciter current frequency spectrum of the transformed exciter current signal. $f_r$ is the rotation frequency of the rotor of the synchronous machine and "s" is the rotor slip of the rotating exciter, now acting as an induction generator.

TABLE II

| Electro-mechanical fault type | Signature in harmonic content of the exciter current |
|---|---|
| Rotor short-circuit | $f_s + f_r, f_s - f_r$ |
| Stator short-circuit | $3*f_s(1 - 2s)$ |

Thus, in the event that it is determined by the processing circuitry 5 that the harmonic content of the exciter current frequency spectrum contains symmetrical sidebands around $f_s$, with a first dominant frequency component at the sum of the power supply frequency and the rotation frequency of the rotor and a second dominant frequency component at the difference between the power supply frequency and the rotation frequency of the rotor, it can be concluded that a rotor short-circuit fault has occurred at the rotor of the synchronous machine.

In the event that it is determined by the processing circuitry 5 that the harmonic content of the exciter current frequency spectrum contains a dominant frequency component at three times the difference between the power supply frequency and two times the rotor slip, i.e. at $3*f_s(1-2s)$, it can be concluded that a stator short-circuit fault has occurred at the stator of the synchronous machine.

With a dominant frequency component, or peak, is meant a significant amplitude divergence from the amplitude of the surrounding frequencies. Typically the amplitude of a dominant frequency component is several times greater than the amplitudes of the frequencies surrounding the dominant frequency component in the exciter current frequency spectrum.

In the event that it is determined by the processing circuitry 5 that the harmonic content of the exciter current frequency spectrum comprises a dominant frequency component at the rotation frequency $f_r$ of the rotor 14, compared to a frequency component at the rotation frequency of the rotor 14 present during healthy conditions, and the DC component of the exciter current signal is greater than during healthy conditions, it is determined that a static eccentricity fault is present. This is true for rotating exciters, in particular DC/AC exciters. Thus, the amplitude of the frequency component at the rotation frequency $f_r$ of the rotor 14, is increased during static eccentricity fault, i.e. when the rotor statically deviates from its central rotation axis inside the stator.

In case of an AC/AC exciter, the dominant frequency component, which is the signature of a static eccentricity fault in this case, is a function of the rotation frequency $f_r$ of the rotor 14 and the slip s.

In a similar manner, the exciter current frequency spectra of a static exciter contain signatures in the exciter current frequency spectra for rotor and stator faults of the synchronous machine. Theoretically, the signature should be similar as for the rotating exciter that has AC/AC type of stator-rotor arrangement as explained above.

Figure 3:
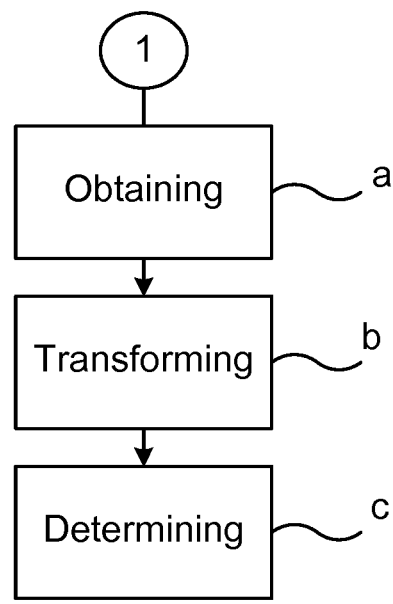
FIG. 3 is a flow chart of a method of determining a fault condition in a synchronous machine, which may be carried out by the synchronous machine electro-mechanical fault condition monitoring system in FIG. 2.

With reference to FIG. 3, a method of determining an electro-mechanical fault condition in a synchronous machine by means of the synchronous machine electro-mechanical fault condition monitoring system 1 will now be described.

The exciter current sensor 3 of the synchronous machine electro-mechanical fault condition monitoring system 1 is coupled to the stationary windings of an exciter. In the event of a rotational exciter, the exciter current sensor 3 is coupled to the exciter stator windings. In the event that the exciter is a static exciter, the exciter current sensor 3 is coupled to the primary windings of the transformer of the exciter.

The exciter current flowing through the stationary windings is measured by the exciter current sensor 3.

In a step a) the processing circuitry 5 obtains an exciter current signal from the exciter current sensor 3. The exciter current signal can be the analog measurement signal of the exciter current sent by the exciter current sensor 3, or it can be a digital representation of the measured exciter current, depending on the particular implementation of the synchronous machine electro-mechanical fault condition monitoring system 1. In the former case, the analog measurement signal is converted to a digital signal when obtained by the processing circuitry 5, whilst in the latter case it has already been converted when obtained by the processing circuitry 5.

In a step b) the exciter current signal is transformed by the processing circuitry to obtain an exciter current frequency spectrum. As previously mentioned, this may be a Fourier transform e.g. Fast Fourier Transformer (FFT), or any other mathematical transformation which transforms a time domain signal to the frequency domain.

In a step c) the processing circuitry 5 determines whether an electro-mechanical fault condition is present based on the harmonic content of the exciter current frequency spectrum, in particular on harmonic content related to the stator frequency of the stator 16, as the rotation frequency of the rotor is also related to the stator frequency. The rotation frequency of the rotor is related to the stator frequency by the number of pole pairs of the synchronous machine 10. In general, the harmonic content of interest includes a component that is a rational number or an integer multiple of the stator frequency. Furthermore, based on the content of the frequency spectrum, a type of electro-mechanical fault condition may also be determined. The particular dominant frequency components of the harmonic content which determine whether a fault condition is present and the type of electro-mechanical fault have been presented above, in conjunction with tables I and II, and when discussing static eccentricity fault signature spectra.

In the case of a static exciter, the exciter current signal is the rectifier output current output by the rectifier that feeds the brushes.

It is envisaged that the system and method presented herein may be utilised in a smart synchronous machine environment to diagnose electro-mechanical fault conditions of the synchronous machine, and to estimate the lifetime of the synchronous machine. By means of the system and method, it may be possible to determine fault conditions of a synchronous machine and to estimate when a complete breakdown of the synchronous machine would occur if a fault condition is not handled properly. The synchronous machine electro-mechanical fault condition monitoring system and method may be utilised in conjunction with synchronous generators and synchronous motors, involving any voltage levels utilised by such machines.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A method of determining an electro-mechanical fault condition in a synchronous machine having a stator, a rotor, and an exciter, wherein the exciter is a rotating exciter having an exciter stator, an exciter rotor, and exciter stator windings, wherein the rotating exciter has a DC/AC type of stator-rotor arrangement, wherein the method comprises:
   a) obtaining an exciter current signal which is a measurement of an exciter current flowing through the exciter stator windings of the exciter, wherein the exciter current signal is an exciter stator current,
   b) transforming the exciter current signal to obtain an exciter current frequency spectrum, and
   c) determining that a static eccentricity fault is present in case the harmonic content of the exciter current frequency spectrum comprises a dominant frequency component at the rotation frequency (fr) of the rotor compared to a frequency component at the rotation frequency of the rotor present during healthy conditions, and a direct current, DC, component of the exciter current signal is greater than during healthy conditions.

2. The method as claimed in claim 1, wherein in case the harmonic content of the exciter current frequency spectrum comprises a dominant frequency component at six times the power supply frequency it is determined in step c) that a rotor short-circuit fault is present.

3. The method as claimed in claim 2, wherein in case it is determined in step c) that the harmonic content of the exciter current frequency spectrum contains a dominant frequency component at two times the power supply frequency it is concluded that a stator short-circuit fault has occurred at the stator of the synchronous machine.

4. The method as claimed in claim 1, wherein in case it is determined in step c) that the harmonic content of the exciter current frequency spectrum contains a dominant frequency component at two times the power supply frequency it is concluded that a stator short-circuit fault has occurred at the stator of the synchronous machine.

5. A method of determining an electro-mechanical fault condition in a synchronous machine having a stator, a rotor, and an exciter, wherein the exciter is a rotating exciter having an exciter stator, an exciter rotor, and exciter stator windings, wherein the rotating exciter has an AC/AC type of stator-rotor arrangement, wherein the method comprises:

a) obtaining an exciter current signal which is a measurement of an exciter current flowing through exciter stator winding of the exciter, wherein the exciter current signal is an exciter stator current, b) transforming the exciter current signal to obtain an exciter current frequency spectrum, and c) determining that a stator short-circuit fault is present in case the harmonic content of the exciter current frequency spectrum comprises a dominant frequency component at 3fs*(1−2s), where fs is the power supply frequency and s is the rotor slip of the exciter.

6. The method as claimed in claim 5, wherein in case the harmonic content of the exciter current frequency spectrum comprises a first dominant frequency component at the difference of the power supply frequency and a rotation frequency of the rotor and a second dominant frequency component at the sum of the power supply frequency and the rotation frequency of the rotor, it is determined in step c) that a rotor short-circuit fault is present.

7. A non-transitory computer readable medium having instructions comprising computer-executable components for causing a synchronous machine electro-mechanical fault condition monitoring system to perform the method having the following steps: obtaining an exciter current signal which is a measurement of an exciter current flowing through the exciter stator windings of the exciter, wherein the exciter current signal is an exciter stator current, a) transforming the exciter current signal to obtain an exciter current frequency spectrum, and b) determining that a static eccentricity fault is present in case the harmonic content of the exciter current frequency spectrum comprises a dominant frequency component at the rotation frequency (fr) of the rotor compared to a frequency component at the rotation frequency of the rotor present during healthy conditions, and a direct current, DC, component of the exciter current signal is greater than during healthy conditions.

8. A synchronous machine electro-mechanical fault condition monitoring system comprising:

an exciter current sensor arranged to measure an exciter current flowing through stationary windings of an exciter, processor circuitry arranged to receive an exciter current signal of a measured exciter current, from the exciter current sensor, and a storage unit storing instructions that, when executed by the processor circuitry causes the synchronous machine electro-mechanical fault condition monitoring system to perform a method, wherein the method includes:

a) obtaining an exciter current signal which is a measurement of an exciter current flowing through the exciter stator windings of the exciter, wherein the exciter current signal is an exciter stator current, b) transforming the exciter current signal to obtain an exciter current frequency spectrum, and c) determining that a static eccentricity fault is present in case the harmonic content of the exciter current frequency spectrum comprises a dominant frequency component at the rotation frequency (fr) of the rotor compared to a frequency component at the rotation frequency of the rotor present during healthy conditions, and a direct current, DC, component of the exciter current signal is greater than during healthy conditions.

* * * * *